(12) United States Patent
Harada et al.

(10) Patent No.: US 7,605,405 B2
(45) Date of Patent: Oct. 20, 2009

(54) SEMICONDUCTOR LIGHT EMITTING DEVICE HAVING FIRST AND SECOND RESINS

(75) Inventors: Mitsunori Harada, Tokyo (JP); Kazuhiko Ueno, Tokyo (JP); Takashi Ebisutani, Tokyo (JP); Masao Aoyama, Tokyo (JP); Kaori Tachibana, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 77 days.

(21) Appl. No.: 11/076,138

(22) Filed: Mar. 10, 2005

(65) Prior Publication Data
US 2005/0205876 A1    Sep. 22, 2005

(30) Foreign Application Priority Data
Mar. 22, 2004   (JP)   ............... 2004-082736

(51) Int. Cl.
*H01L 33/00*  (2006.01)
(52) U.S. Cl. ..................................... 257/100
(58) Field of Classification Search .................. 257/100
See application file for complete search history.

(56) References Cited

U.S. PATENT DOCUMENTS

| | | | | |
|---|---|---|---|---|
| 5,959,316 | A * | 9/1999 | Lowery ........................ | 257/98 |
| 6,066,861 | A | 5/2000 | Hohn et al. .................... | 257/99 |
| 6,245,259 | B1 | 6/2001 | Hohn et al. ............. | 252/301.36 |
| 6,277,301 | B1 | 8/2001 | Hohn et al. ............. | 252/301.36 |
| 6,576,930 | B2 | 6/2003 | Reeh et al. ..................... | 257/98 |
| 6,592,780 | B2 | 7/2003 | Hohn et al. ............. | 252/301.36 |
| 6,613,247 | B1 | 9/2003 | Hohn et al. ............. | 252/301.36 |
| 6,653,661 | B2 * | 11/2003 | Okazaki ....................... | 257/98 |
| 6,669,866 | B1 | 12/2003 | Kummer et al. ....... | 252/301.4 R |
| 6,774,401 | B2 | 8/2004 | Nakada et al. ................. | 257/82 |
| 6,809,342 | B2 | 10/2004 | Harada ......................... | 257/79 |
| 6,812,500 | B2 | 11/2004 | Reeh et al. ..................... | 257/98 |
| 7,075,116 | B2 * | 7/2006 | Okazaki ....................... | 257/98 |
| 2003/0230751 | A1 * | 12/2003 | Harada ......................... | 257/80 |

FOREIGN PATENT DOCUMENTS

| | | |
|---|---|---|
| JP | 10-190065 | 12/1996 |
| JP | 2001-127346 | 10/1999 |

(Continued)

*Primary Examiner*—Howard Weiss
(74) *Attorney, Agent, or Firm*—Cermak Kenealy Vaidya & Nakajima LLP

(57) ABSTRACT

A semiconductor light emitting device and method of manufacturing the same can provide a light source that has less variation in color and brightness and can reduce radiation of light that is possibly harmful to humans. The device can include a casing that has a first cavity having an oblique surface with a reflective surface formed thereon and a second cavity having an almost vertical side. A reflective frame having an oblique surface with a third reflective surface formed thereon can be formed on the casing. A semiconductor light emitting element can be mounted on the bottom in the first cavity. A first resin composed of a light-transmissive resin can be filled in the first cavity and then cured. Further, a second resin containing a fluorescent material dispersed in a light-transmissive resin can be filled in the second cavity and then cured while the casing is turned upside down to form a high-density fluorescent material layer near the surface of the second resin.

15 Claims, 4 Drawing Sheets

FOREIGN PATENT DOCUMENTS

| | | |
|---|---|---|
| JP | 2001-196639 | 1/2000 |
| JP | 2001-210872 | 1/2000 |
| JP | 2001-345483 | 5/2000 |
| JP | 2002-151743 | 5/2002 |
| JP | 2004-056075 | 12/2002 |
| JP | 2003-234511 | 8/2003 |

* cited by examiner

SEMICONDUCTOR LIGHT EMITTING DEVICE HAVING FIRST AND SECOND RESINS

This application claims the priority benefit under 35 U.S.C. §119 of Japanese Patent Application No. 2004-082736 filed on Mar. 22, 2004, which is hereby incorporated by reference.

BACKGROUND OF THE INVENTION

1. Field of the Invention

The invention relates to a semiconductor light emitting device and method of manufacturing the same. More particularly, it relates to a semiconductor light emitting device which provides a light of any emission color produced by additive color mixture in which light emitted from a semiconductor light emitting element is combined with light emitted from the semiconductor light emitting element and wavelength-converted by a fluorescent material, and method of manufacturing the same.

2. Description of the Related Art

A (LED) chip operative to emit a light having a sharp spectral distribution can be employed as a light source to realize an LED that emits a white light. In this case, the light emitted from the LED chip is subjected to additive color mixture with a wavelength-converted light created from a fluorescent material when excited by the light emitted from the LED chip.

For example, if the light emitted from the LED chip is a blue light, a fluorescent material is employed that can wavelength-convert the blue light into its complementary yellow light when excited by the blue light. In this case, the blue light emitted from the LED chip is subjected to additive color mixture to yield a white light, with the wavelength-converted yellow light created from the fluorescent material when excited by the blue light emitted from the LED chip.

Similarly, when the light emitted from the LED chip is blue light, two types of fluorescent materials may be employed in combination to wavelength-convert the blue light into respective green and red lights when excited by the blue light. In this case, the blue light emitted from the LED chip is subjected to additive color mixture to yield a white light, with wavelength-converted green and red lights created from the two types of fluorescent materials when excited by the blue light emitted from the LED chip.

If the light emitted from the LED chip is an ultraviolet light, three types of fluorescent materials may be employed in combination to wavelength-convert the ultraviolet light into blue, green and red lights respectively when excited by the ultraviolet light. In this case, the ultraviolet light emitted from the LED chip excites the three types of fluorescent materials to create the wavelength-converted blue, green and red lights, which are subjected to additive color mixture with each other to yield a white light.

Further, the emission color of light emitted from the LED chip can be combined appropriately with any fluorescent material serving as a wavelength converter to create various toned colors other than white light.

FIG. 4 shows an example of an LED in which fluorescent material is excited by light emitted from the light source for wavelength conversion to provide a toned light different from the light emitted from the light source, as described above. A light emitting element 51 is disposed on the bottom in a cup 52 and electrically connected thereto through a bonding wire 56. A fluorescent material 53 serving as a wavelength converter is dispersed in a resin 54, which is filled in the cup 52. A lid is provided to close the top of a casing 55, which is then turned upside down for thermal setting of the resin 54. Thus, the fluorescent material 53 having a larger specific gravity than that of the resin sinks and collects in the upper portion of the cup 52. As a result, the fluorescent material 53 is more densely distributed in the upper portion than the lower portion of the cup 52 in a finished LED (see JP-A 2002-151743, for example).

In another example shown in FIG. 5, an LED chip 61 is disposed on the bottom in a cup 63 and electrically connected thereto through a bonding wire 62. A first light-transmissive resin 64 is filled in the cup 63 by about 60-70% of the cap volume and heated. A second light-transmissive resin 66 is further injected onto the first resin by about 50-60% of the cap volume. The second resin contains a fluorescent material 65 serving as a wavelength converter dispersed in a light transmissive resin. This device is turned upside down for thermal setting. Consequently, the second light-transmissive resin 66 expands to project at the outer rim of the cup 63, and the fluorescent material 65 dispersed in the second light-transmissive resin 66 sinks and collects in the upper portion that is expanded outwards in a projected convex surface. As a result, the fluorescent material 65 is more densely distributed in the vicinity of the upper surface that is formed like a convex lens in the finished LED (see JP-A 2003-234511, for example).

In the above-described conventional LEDs, the former requires thermal setting of the resin that is filled in the cup to be performed in a state in which a lid is placed on the top of the casing and the casing is turned upside down. Therefore, the top of the casing must be brought entirely into intimate contact with the lid without leaving any gap therebetween. If even a little gap is present, the resin flows out through the gap, causing a failed product.

In particular, if a number of cups are formed in a large casing for mass production in batch, it is difficult to ensure an extremely high surface accuracy that would bring the cup tops into intimate contact with the lid over the entire surface. Even if possible, it obviously results in high costs. In addition, heat during thermal setting of the resin can cause deformations such as expansions and deflections in both the casing and the lid. Such deformations increasingly prevent the intimate contact between both members and inevitably lead to poor production yield.

Further, in order to increase the amount of light emission, the light emitting element can be upsized to allow a large current to flow therethrough. In practice, however, the package has a limit in size. Therefore, the cup that is employed to hold the light emitting element therein is also limited in size. As a result, the light emitting element has a larger proportion in the inner volume of the cup than a conventional LED of the same type. In other words, a spatial volume of the cup, obtained by subtracting the volume of the light emitting element from the inner volume of the cup, has a decreased ratio to the inner volume of the cup.

As a result, the distance between the side of the light emitting element and the inner circumferential surface of the cup approaches the distance between the upper surface of the light emitting element and the top of the fluorescent material-dispersed resin that is filled in the cup. In this case, a larger amount of resin is present between the side of the light emitting element and the inner circumferential surface of the cup as compared to the amount of resin present between the upper surface of the light emitting element and the top of the resin. This relation is similarly found between the amounts of the fluorescent material dispersed in the resin.

Again, a lid can be placed on the casing, which is then turned upside down for thermal setting of the resin. As a result, the fluorescent material having a larger specific gravity than that of the resin sinks and collects in the upper portion of the cup to form the LED. The fluorescent material is more densely distributed in the upper portion than the lower portion of the cup. In this case, a larger amount of the fluorescent material in the resin is present between the side of the light emitting element and the inner circumferential surface of the cup as compared to the amount of fluorescent material present between the upper surface of the light emitting element and the top of the resin. Therefore, when the device is turned upside down for thermal setting of the resin, a larger amount of fluorescent material is precipitated around the light emitting element as compared to the amount of the fluorescent material precipitated above the light emitting element. This makes it difficult to form a uniform layer of fluorescent material.

As a result, the light emitted from the light emitting element to the layer of fluorescent material excites the fluorescent material to varying degrees depending on location. Therefore, a problem arises because the light source has color variations. In an LED configured to emit a white light, color variations are strictly regulated in practice because variation creates a high possibility of degrading the light yield.

In the latter, on the other hand, the first light-transmissive resin climbs up to the outer rim of the cup due to surface tension. In this condition, the second, fluorescent material-dispersed, light-transmissive resin forms a convex-lens-like projection on the first resin to provide a layer of high-density fluorescent material near the surface of the convex-lens-like projection. In this case, the amount of fluorescent material is less at the ends as compared to at the convex projection of the second light-transmissive resin. In addition, the second light-transmissive resin may not sufficiently reach the "climbed" portion of the first light-transmissive resin, and it is possible that no layer of fluorescent material is formed therein.

Originally, an LED was desired in which additive color mixture of the light emitted from the light emitting element with the wavelength-converted light produces a white light with no color variation in almost all directions. A light emitted from the light emitting element and directly radiated from the LED without passing through the layer of fluorescent material may be present within a certain region. In that region, only the light emitted from the light emitting element (not the light produced through additive color mixture) is radiated as it is.

In this case, if the light emitted from the light emitting element is a blue light having a peak emission wavelength of about 450-470 nm, the light emitted from the light emitting element, guided through a region with the layer of fluorescent material formed therein, and radiated from the LED becomes a white light (W). In contrast, the light emitted from the light emitting element, guided through a region with no layer of fluorescent material formed therein, and radiated from the LED becomes a blue light (B). Therefore, such an LED radiates a light with color variations in white and blue and is not an excellent white LED product.

The light emitted from the light emitting element may have a peak emission wavelength within a short wavelength range of about 400 nm or less. If such an ultraviolet light is directly radiated from the LED and enters human eyes, it may cause some ill effect, which is not preferred.

The present invention has been made in consideration of the above and various other problems and issues, and accordingly can provide a semiconductor light emitting device, which may serve as a light source that has less variation in color and brightness and can reduce radiation of light that may possibly be harmful to humans, and a method of manufacturing the same.

SUMMARY OF THE INVENTION

To address and attempt to solve the above and other problems, in a first aspect the invention, a semiconductor light emitting device can include a casing including a first cavity formed in a conical shape opened upward and having an inner circumferential surface serving as a reflective surface. At least one cavity can be provided above the first cavity; at least one semiconductor light emitting element can be mounted on the bottom in the first cavity; a first resin can be filled in the first cavity to seal the at least one semiconductor light emitting element entirely; and a second resin can be filled in the at least one cavity provided above the first cavity.

In another aspect of the invention, the first resin can be composed of a light-transmissive resin, and the first resin can include a surface formed to be almost planar.

In yet another aspect of the invention, the second resin may be composed of a light-transmissive resin containing a wavelength converter dispersed therein.

In a further aspect of the invention, the semiconductor light emitting device can include a layer of a high-density wavelength converter formed near the surface of the second resin.

In another aspect of the invention, the semiconductor light emitting device can further include a reflective frame provided above the casing and having a recessed oblique reflective curved surface. The curved surface may be formed by an imaginary line that is revolved about an optical axis of the at least one semiconductor light emitting element and which is opened or angled substantially toward the front in the direction of radiation from the at least one semiconductor light emitting element.

In another aspect of the invention, a method of manufacturing a semiconductor light emitting device can include providing a casing including a first cavity having an inner circumferential surface opened upward for serving as a reflective surface, and at least one cavity provided above the first cavity. The method can include mounting at least one semiconductor light emitting element on the bottom in the first cavity; filling a first resin in the first cavity and setting the first resin to seal the at least one semiconductor light emitting element entirely; and filling a second resin in all the at least one cavity provided above the first cavity, and then setting the second resin while turning the casing upside down.

In yet another aspect of the invention, the first resin can be composed of a light-transmissive resin.

In another aspect of the invention, the second resin can be composed of a light-transmissive resin containing a wavelength converter dispersed therein.

BRIEF DESCRIPTION OF THE DRAWINGS

These and other features and advantages of the invention will become clear from the following description of exemplary embodiments and with reference to the accompanying drawings, wherein.

DETAILED DESCRIPTION OF PREFERRED EMNODIMENTS

Figure 1:
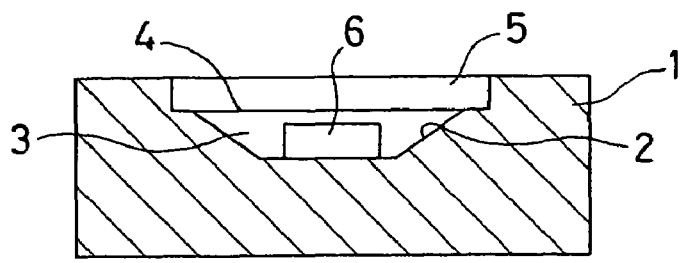
FIGS. 1A-E are process diagrams showing an embodiment of a device and a method of manufacturing a semiconductor light emitting device according to the invention.
Figure 1:
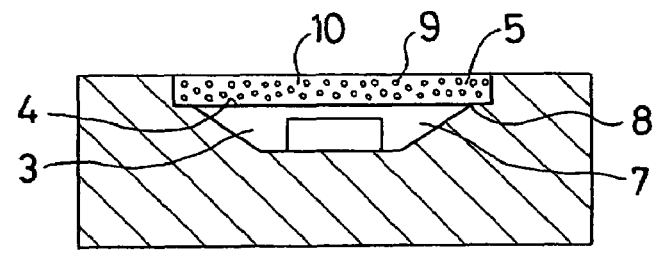
Figure 1:
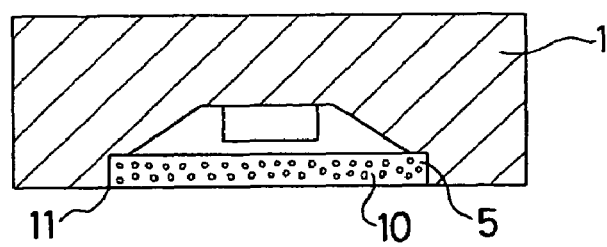
Figure 1:
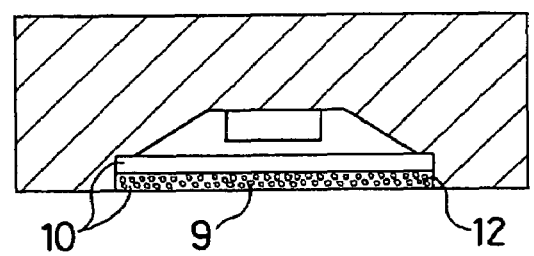
Figure 1:
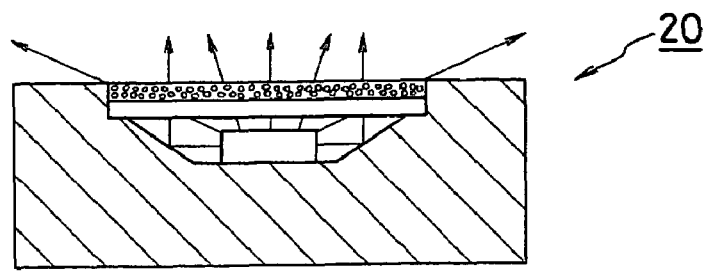

Hereinafter, description will be given of the invention with reference to the drawing figures, wherein like reference numerals designate identical or corresponding elements throughout the several figures. Incidentally, various modifications can be made without departing from the gist of the invention. It is intended that various modifications of the exemplary embodiments described herein can be made and would fall within the scope of the invention.

A semiconductor light emitting device can be configured to provide less variation in color and brightness and can reduce radiation of light that is possibly harmful to humans. A plurality of cavities can be employed in a casing to configure a space for mounting a semiconductor light emitting element and for filling a resin or resins therein. A layer of a high-density wavelength converter can be formed at an almost uniform density and with an almost uniform thickness over substantially the entire surface near an exit surface that is employed for externally radiating the light emitted from the semiconductor light emitting element.

Figure 2:
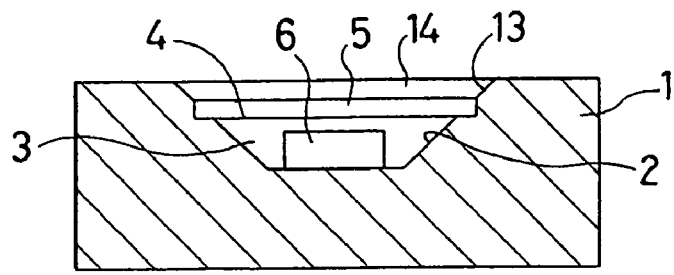
FIGS. 2A-E are process diagrams showing another embodiment of a device and a method of manufacturing a semiconductor light emitting device according to the invention.
Figure 2:
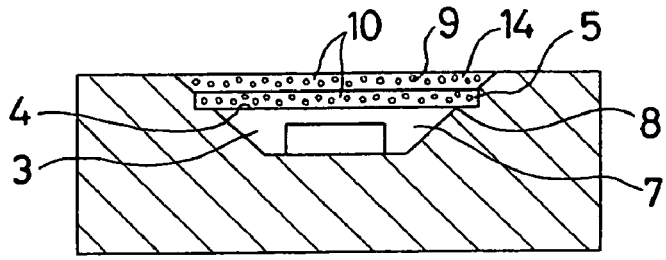
Figure 2:
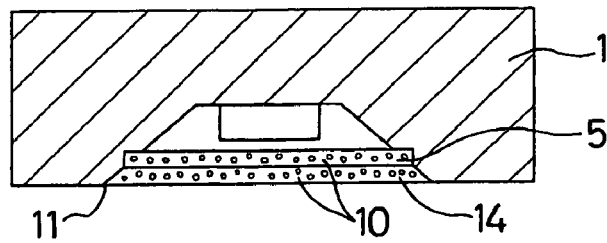
Figure 2:
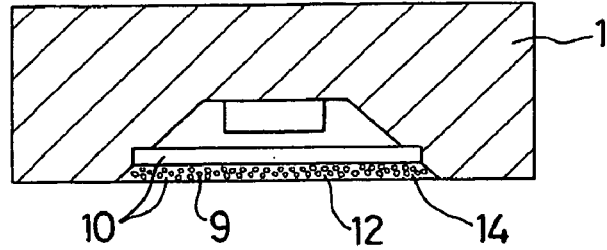
Figure 2:
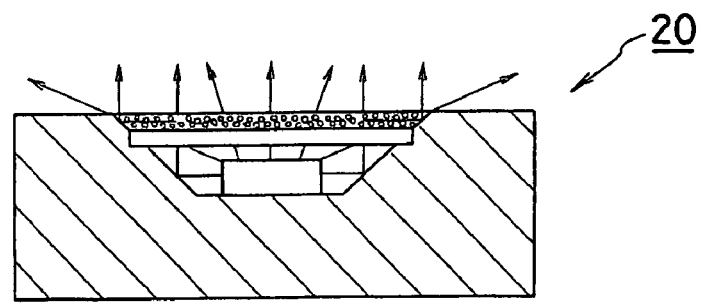
Figure 3:
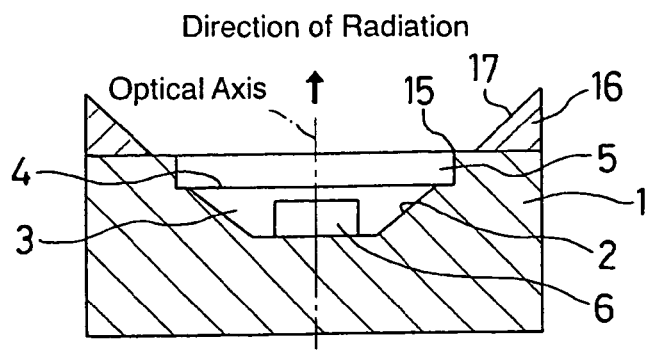
FIGS. 3A-E are process diagrams showing another embodiment of a device and a method of manufacturing a semiconductor light emitting device according to the invention.
Figure 3:
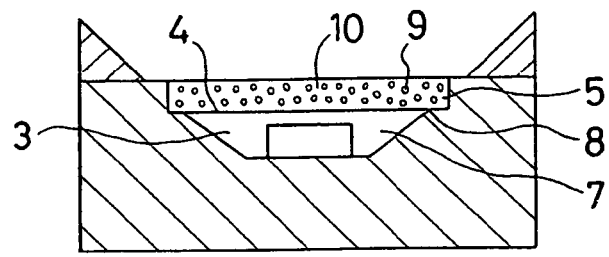
Figure 3:
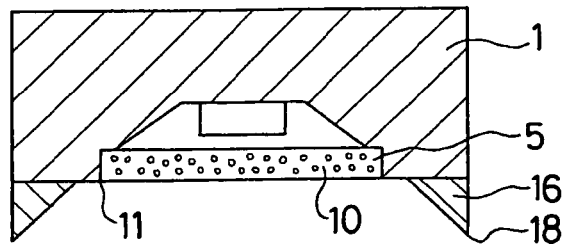
Figure 3:
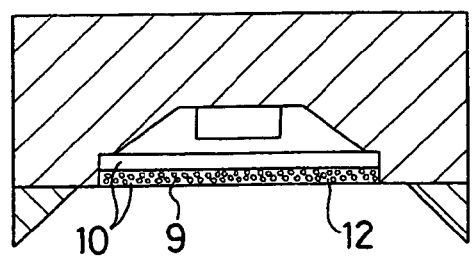
Figure 3:
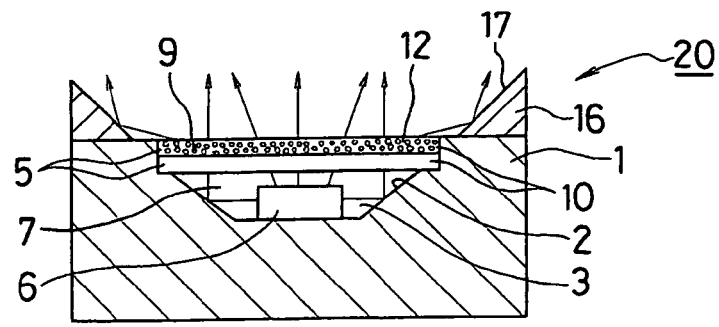
Figure 4:
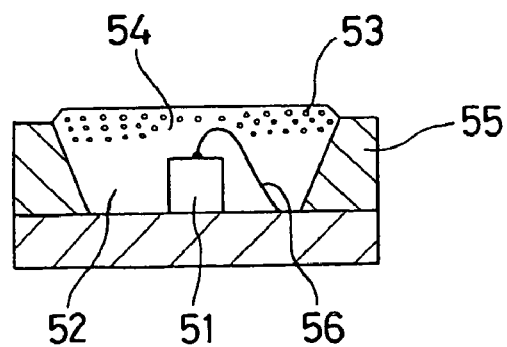
FIG. 4 is a cross-sectional view showing a related art device.
Figure 5:
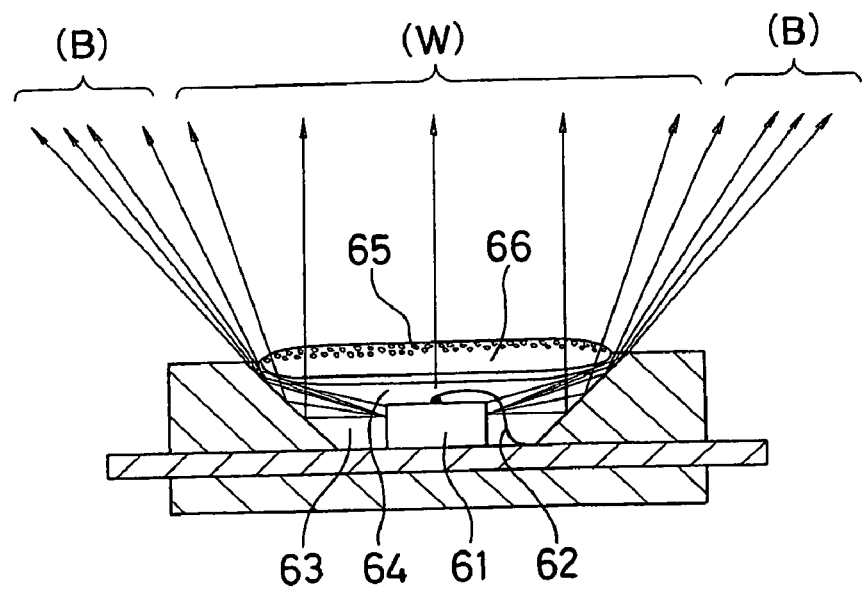
FIG. 5 is a cross-sectional view showing another related art device.

Various embodiments of the invention will now be described below in detail with reference to FIGS. 1-3 (with the same reference numerals denoting the same or like parts). As the below-described embodiments are suitably specified examples of the invention, they are given various technical features. However, the scope of the invention is not limited to these embodiments.

FIGS. 1A-E are process diagrams showing an embodiment of a method of manufacturing a semiconductor light emitting device according to the invention. A casing 1 can be provided and formed to include a first cavity 3 and a second cavity 5 formed therein as shown in FIG. 1A. The first cavity 3 can be conically shaped and have a bottom and an inner circumferential surface provided with a first reflective surface 2 thereon. The second cavity 5 can be located above the first cavity 3 and have a common plane 4 shared with the first cavity 3, which is larger than the first cavity 3, and an almost vertically upstanding inner circumferential surface.

A semiconductor light emitting element 6 can be mounted on the bottom in the first cavity 3. The semiconductor light emitting element 6 uses a forward voltage applied across an anode electrode and a cathode electrode of the semiconductor light emitting element 6 to emit light. Therefore, a connection means can be applied to electrically connect the anode and cathode electrodes of the semiconductor light emitting element 6 with terminals that lead out and are connected to a power source, though it is omitted from the figure in this embodiment.

Next, as shown in FIG. 1B, a light-transmissive resin (e.g., first resin 7) can be filled in the first cavity 3 up to the upper surface of the first cavity 3 (e.g., the common plane 4 between the first cavity 3 and the second cavity 5) and cured. In this case, the amount and type of first resin 7 that is used to fill in the first cavity 3 can be determined by considering the amount of retraction that occurs during curing. Namely, the resin can be filled to be almost planar with or project from (e.g., shaped in a projection on) the upper surface of the first cavity 3 to achieve formation of an almost planar surface after curing. In either case, an adhesion between an upper surface inner rim 8 of the first cavity 3 and the first resin 7, and a surface tension due to an appropriate viscosity of the first resin 7, prevent the first resin 7 from flowing into the second cavity 5.

Further, a light-transmissive resin (e.g., second resin 10) containing a fluorescent material 9 dispersed therein that serves as a wavelength converter can be filled in the second cavity 5 up to the upper surface of the second cavity 5. In this case, the type and amount of second resin 10 can be determined in consideration of the amount of retraction that the resin will undergo on curing. Namely, the amount of resin can be determined such that it fills the second cavity to a point that is either almost planar with or projects from (e.g., shaped in a projection on) the upper surface of the second cavity 5 to achieve formation of an almost planar surface after curing.

Next, the casing 1 can be turned upside down as shown in FIG. 1C and the second resin 10 that is filled in the second cavity 5 can be cured. In this case, surface tension due to an appropriately selected viscosity for the second resin 10 combined with an adhesion between the second resin 10 and an upper surface inner rim 11 of the second cavity 5 act against the gravity working on the second resin 10 when the casing 1 is turned upside down. This action is effective to prevent the second resin 10 from leaking out of the second cavity 5. Accordingly, no lid is required to prevent leakage of the second resin 10.

In the process of curing the second resin that is located in the second cavity while the casing is turned upside down, as shown in FIG. 1D, the fluorescent material 9 sinks and deposits near the surface of the second resin 10 to form a high-density fluorescent material layer 12. This is possible when the fluorescent material 9 has a larger specific gravity than that of the light-transmissive resin.

Finally, a semiconductor light emitting device 20 can be completed as shown in FIG. 1E. The semiconductor light emitting device of this embodiment can include an optical system, which is described below. The light emitted from the semiconductor light emitting element 6 can be guided through the first resin 7 and the second resin 10 in turn. It can then be partly externally emitted and partly wavelength-converted at the high-density fluorescent material layer 12 and externally emitted. These two types of light are recognized as a toned light through additive color mixture. The light emitted from the semiconductor light emitting element 6 toward the first reflective surface 2 can be guided through the first resin 7, then reflected and direction-converted at the first reflective surface 2, and guided through the second resin 10. It can then be partly externally emitted and partly wavelength-converted at the high-density fluorescent material layer 12 and externally emitted. These two types of light are recognized as a toned light achieved through additive color mixture as described above. In this way, the light externally emitted from the semiconductor light emitting element 6 can pass through two optical paths. Therefore, the amount of the light emitted from the semiconductor light emitting element 6 is equal to a total of the amount of the light passing through the two optical paths and emitted/released. Thus, the device has a structure that can achieve a brighter light source with a higher efficiency with regard to light extraction.

In related art devices, the light emitted from the semiconductor light emitting element can not reach an area in the vicinity of a step at a common plane between first and second cavities because the step prevents it. Accordingly, the fluorescent material dispersed in the area is not effective for wavelength conversion and results in a light source with variations in color and brightness. To the contrary, in the above-described embodiment, the high-density fluorescent material layer 12 can be formed at a location in the vicinity of the surface of the second cavity 5, and can be located higher than normally shown in the related art. Thus, the light emitted from the semiconductor light emitting element 6 is not blocked in this embodiment and can fully reach the high-density fluorescent material layer 12. As a result, a light source with decreased variations in color and brightness can be achieved.

FIGS. 2A-E are process diagrams showing another embodiment of a method of manufacturing a semiconductor light emitting device according to the invention. The embodiment of FIGS. 2A-E is similar to the first embodiment in the method of manufacturing a semiconductor light emitting device. However, the cavity formed in the casing can be formed to include three portions.

The method of manufacturing a semiconductor light emitting device of the embodiment of FIGS. 2A-E is described below even though it contains features similar to those of the embodiment of FIGS. 1A-E. A casing 1 can be provided that includes a first cavity 3, a second cavity 5 and a third cavity 14 formed therein as shown in FIG. 2A. The first cavity 3 can be conically shaped and have a first reflective surface 2 provided on a bottom and an inner circumferential surface. The second cavity 5 can be located above the first cavity 3 and have a common plane 4 shared with the first cavity 3, which can be larger in circumference than the first cavity 3, and can include an almost vertically upstanding inner circumferential surface. The third cavity 14 can be located above the second cavity 5 and have an inner circumferential surface provided with a second reflective surface 13 thereon. The second reflective surface 13 can be configured to substantially extend from the inner circumferential conical surface of the first cavity 3 (although not integral with the surface of the first cavity 3).

A semiconductor light emitting element 6 can be mounted on a bottom of the first cavity 3. The semiconductor light emitting element 6 can utilize a forward voltage applied across an anode electrode and a cathode electrode of the semiconductor light emitting element 6 to emit light. Therefore, a connection means can be applied to electrically connect the anode and cathode electrodes of the semiconductor light emitting element with terminals that can lead externally outward and be connected to a power source.

As shown in FIG. 2B, a light-transmissive resin (e.g., first resin 7) can be filled in the first cavity 3 up to the upper surface of the first cavity 3 (e.g., the common plane 4 between the first cavity and the second cavity) and cured. In this case, the amount and type of first resin 7 can be determined in consideration of the amount of retraction that occurs during curing. Namely, the resin can be filled to be almost planar with or project from (e.g., shaped in a projection on) the upper surface of the first cavity 3 to achieve formation of an almost planar surface after curing. In either case, an adhesion between an upper surface inner rim 8 of the first cavity 3 and the first resin 7, and a surface tension due to an appropriately selected viscosity of the first resin 7, prevent the first resin 7 from flowing into the second cavity 5.

Further, a light-transmissive resin (e.g., second resin 10) containing a fluorescent material 9 dispersed therein that serves as a wavelength converter can be filled in the second cavity 5 and the third cavity 14 up to the upper surface of the third cavity 14. In this case, the type and amount of second resin 10 can be determined in consideration of the amount of retraction that the resin will undergo on curing. Namely, the amount of resin can be determined such that it fills the second and third cavity to a point that is either almost planar with or projected from (e.g., shaped in a projection on) the upper surface of the third cavity 14 to achieve formation of an almost planar surface after curing.

Next, the casing 1 can be turned upside down as shown in FIG. 2C and the second resin 10 that is filled in the second cavity 5 and the third cavity 14 can be cured. In this case, surface tension due to an appropriately selected viscosity for the second resin 10 combined with an adhesion between the second resin 10 and an upper surface inner rim 11 of the third cavity 14 act against gravity working on the second resin 10 when the casing is turned upside down. This action is effective to prevent the second resin 10 from leaking out of the second cavity 5 and the third cavity 14. Accordingly, no lid is required to prevent leakage of the second resin 10.

In the process of curing the second resin that is located in the second cavity and the third cavity while the casing is turned upside down, as shown in FIG. 2D, the fluorescent material 9 sinks and deposits in the third cavity 14 to form a high-density fluorescent material layer 12. This is possible when the fluorescent material has a larger specific gravity than that of the light-transmissive resin.

Finally, a semiconductor light emitting device 20 can be completed as shown in FIG. 2E. The semiconductor light emitting device of this embodiment can include an optical system, which is described below. The light emitted from the semiconductor light emitting element 6 can be guided through the first resin 7 and the second resin 10 in turn. It can then be partly externally emitted and partly wavelength-converted at the high-density fluorescent material layer 12 and externally emitted. These two types of light are recognized as a toned light achieved through additive color mixture. The light emitted from the semiconductor light emitting element 6 toward the first reflective surface 2 can be guided through the first resin 7, then reflected and direction-converted at the first reflective surface 2, and guided through the second resin 10. It can then be partly externally emitted and partly wavelength-converted at the high-density fluorescent material layer 12 and externally emitted. These two types of light are recognized as a toned light achieved through additive color mixture as described above. Further, the light that is wavelength-converted at the fluorescent material 9 in the high-density fluorescent material layer 12 can include light traveling toward the second reflective surface 13, which is reflected at the second reflective surface 13 and externally emitted. Therefore, even the light that is wavelength-converted at the fluorescent material but that does not immediately emit to the atmosphere can be effectively extracted to be externally emitted in this embodiment. In this way, the light externally emitted from the semiconductor light emitting element 6 can pass through two optical paths. Therefore, the amount of light emitted from the semiconductor light emitting element 6 can be substantially equal to a total of the amount of light passing through the two optical paths and released. Thus, the device has a structure that can achieve a brighter light source with a higher efficiency of light extraction.

In the related art, light emitted from the semiconductor light emitting element can not reach a portion in the vicinity of a step at a common plane between first and second cavities because the step prevents it. Accordingly, the fluorescent material dispersed in that portion is not effective for wavelength conversion and results in a light source with variations in color and brightness. To the contrary, in the embodiment of FIGS. 2A-E, the high-density fluorescent material layer 12 can be formed in the third cavity 14, which can be located higher than is normal in the related art. Thus, the light emitted from the semiconductor light emitting element 6 is not blocked and can reach the fluorescent material layer 12. As a result, a light source with decreased variations in color and brightness can be achieved.

FIGS. 3A-E are process step diagrams showing another embodiment of a method of manufacturing a semiconductor light emitting device including a wavelength converter layer according to the invention. The embodiment of FIGS. 3A-E is similar to the above-described embodiments in the method of manufacturing a semiconductor light emitting device. The embodiment of FIGS. 3A-E can include a reflective frame formed on the casing.

The method of manufacturing a semiconductor light emitting device of the embodiment of FIGS. 3A-E is described below and contains duplicative contents and like reference numerals to denote like parts, as compared to the above-described embodiments of FIGS. 1A-2E. A casing 1 can be provided to include a first cavity 3 and a second cavity 5 formed therein, as shown in FIG. 3A. The first cavity 3 can be conically shaped and have a bottom and an inner circumferential surface provided with a first reflective surface 2 thereon. The second cavity 5 can be located above the first cavity 3 and have a common plane 4 shared with the first cavity 3, which is larger than the first cavity 3, and an almost vertically upstanding inner circumferential surface.

A reflective frame 16 can be provided on the casing 1. The reflective frame can include a recessed oblique curved surface formed thereon. The curved surface can be bounded by imagining the revolution of a straight line that is tilted relative to an optical axis of the semiconductor light emitting element 6 and mounted on the bottom of the first cavity 3. The straight line and the surface it transcribes when revolved about the optical axis can be described as opened from a location outside an upper rim 15 of the second cavity 5 and substantially toward the front and in the direction of radiation from the semiconductor light emitting element 6. A third reflective surface 17 can be formed on this curved surface.

The semiconductor light emitting element 6 can utilize a forward voltage applied across an anode electrode and a cathode electrode of the semiconductor light emitting element 6 to emit light. Therefore, a connection means can be applied to electrically connect the anode and cathode electrodes of the semiconductor light emitting element 6 with terminals that lead out and are connected to an external power source, though it is omitted from the figure in this embodiment.

As shown in FIG. 3B, a light-transmissive resin (e.g., first resin 7) can be filled in the first cavity 3 up to the upper surface of the first cavity 3 (e.g., the common plane 4 between the first cavity 3 and the second cavity 5) and cured. In this case, the amount and type of first resin 7 to be filled in the first cavity 3 can be determined by considering the amount of retraction that occurs during curing. Namely, the resin can be filled to be almost planar with or project from (e.g., shaped in a projection on) the upper surface of the first cavity 3 to achieve formation of an almost planar surface after curing. In either case, an adhesion between an upper surface inner rim 8 of the first cavity 3 and the first resin 7, and surface tension due to an appropriate viscosity of the first resin 7, prevent the first resin 7 from flowing into the second cavity 5.

Further, a light-transmissive resin (e.g., second resin 10) containing a fluorescent material 9 dispersed therein for serving as a wavelength converter can be filled into the second cavity 5 up to the upper surface of the second cavity 5. In this case, the amount and type of second resin 10 can be determined by considering the amount of retraction that the resin will undergo during curing. Namely, the amount of resin can be determined such that it fills the second cavity to a point that is either almost planar with or projects from (e.g., shaped in a projection on) the upper surface of the second cavity 5 to achieve formation of an almost planar surface after curing.

The casing 1 can be turned upside down, as shown in FIG. 3C, and the second resin 10 that is located in the second cavity 5 can be cured. In this case, surface tension due to an appropriately selected viscosity for the second resin 10 combined with an adhesion between the second resin 10 and an upper surface inner rim 11 of the second cavity 5 act against gravity working on the second resin 10 when the casing 1 is turned upside down. This action is effective to prevent the second resin 10 from leaking out of the second cavity 5. Accordingly, no lid is required to prevent leakage of the second resin 10.

When the casing 1 is turned upside down and mounted on a base, the tip 18 of the reflective frame 16 formed on the casing 1 impinges against the base and also serves as a spacer tool. Accordingly, preparation of a spacer for reverse support may not be necessary.

In the process of curing the second resin that is located in the second cavity while the casing is turned upside down, as shown in FIG. 3D, the fluorescent material 9 sinks and deposits near the surface of the second resin 10 to form a high-density fluorescent material layer 12. This is possible when the fluorescent material 9 has a larger specific gravity than that of the light-transmissive resin.

Finally, a semiconductor light emitting device 20 can be completed as shown in FIG. 3E. The semiconductor light emitting device of this embodiment can include an optical system, which is described below. The light emitted from the semiconductor light emitting element 6 can be guided through the first resin 7 and the second resin 10 in turn. It can then be partly externally emitted and partly wavelength-converted at the high-density fluorescent material layer 12 and externally emitted. These two types of light are recognized as a toned light achieved through additive color mixture. The light emitted from the semiconductor light emitting element 6 toward the first reflective surface 2 can be guided through the first resin 7, then reflected and direction-converted at the first reflective surface 2, and guided through the second resin 10. It can then be partly externally emitted and partly wavelength-converted at the high-density fluorescent material layer 12 and externally emitted. These two types of light are recognized as a toned light achieved through additive color mixture, as described above. In this way, the light externally emitted from the semiconductor light emitting element 6 can pass through two optical paths. Therefore, the amount of the light emitted from the semiconductor light emitting element 6 can be substantially equal to a total of the amount of the light passing through the two optical paths and externally emitted. Further, the light externally emitted from the high-density fluorescent material layer 12 can include light traveling toward the third reflective surface 17, which is reflected at the third reflective surface 17. The reflected light then travels toward the front in the direction of emission/radiation. As a result, light that previously could not contribute to the collection of light, as known in the related art, can be collected and effectively emitted in the vicinity of the optical axis of the semiconductor light emitting element 6. Thus, the device can improve the efficiency of available light and achieve a higher brightness.

In the related art, light emitted from the semiconductor light emitting element can not reach an area in the vicinity of a step at the common plane between first and second cavities because the step prevents it. Accordingly, the fluorescent material dispersed in that area is not effective for wavelength conversion and results in a light source with variations in color and brightness. To the contrary, in the above-described embodiment, the high-density fluorescent material layer can be formed at a location in the vicinity of the surface of the first cavity, and can be located higher than the related art. Thus, the light emitted from the semiconductor light emitting element is not blocked in this embodiment and can reach the fluorescent material layer. As a result, a light source with decreased variation in color and brightness can be achieved.

Some of the features that are common in the above-described embodiments are described below. First, the semiconductor light emitting element and a bonding wire (not shown) can be sealed in the light-transmissive resin. The bonding wire is one example of the connection means for electrically connecting the anode and cathode electrodes of the semiconductor light emitting element with the terminals that lead externally outward and are connected to the power source. This configuration aims to protect the semiconductor light emitting element and the bonding wire from mechanical stresses, such as vibrations and impacts, and environmental conditions, such as water content and dirt and dust. In addition, a member can be provided that forms an interface with the light exit surface of the semiconductor light emitting element. This interface-forming member can include a material that has a refractive index close to or higher than the refractive index of the semiconductor material that forms the exit surface of the semiconductor light emitting element. In this case, the light emitted from the semiconductor light emitting element can be controlled to include as little light as possible that is totally reflected at the light exit surface of the semiconductor light emitting element and that returns into the semiconductor light emitting element. Thus, the configuration also aims to allow as much radiation of light from the semiconductor light emitting element through the light exit surface to the interface-forming member as possible to improve the efficiency of extraction of the light from the semiconductor light emitting element.

Accordingly, the first resin (e.g., light-transmissive resin) that seals the semiconductor light emitting element mounted on the bottom of the first conical cavity can be configured to seal the semiconductor light emitting element and the bonding wire completely.

In addition, the high-density fluorescent material layer can be formed in the vicinity of the surface at which the light from the semiconductor light emitting element is emitted into the atmosphere. This configuration aims to scatter and refract the light which is both emitted from the semiconductor light emitting element, wavelength-converted at the fluorescent material, and externally emitted, and light which is emitted from the semiconductor light emitting element and directly and externally emitted, so as to be as uniform as possible. As a result, a light source with less variation in color and brightness can be achieved. It also aims at an improvement in the efficiency of extraction of the light that is wavelength-converted at the fluorescent material.

In the vicinity of the light exit surface of the semiconductor light emitting element, the high-density fluorescent material layer can be formed. Accordingly, the light exit surface can be formed in a surface that includes projected and recessed patterns and that includes the fluorescent material. Therefore, the light, which is emitted from the semiconductor light emitting element and wavelength-converted at the fluorescent material, and the light, which is only emitted from the semiconductor light emitting element, have less deflection at the light exit surface when the surface condition includes projected and recessed patterns. Thus, the light can be provided with averaged scattering and refracting in all orientations. In addition, the light that is wavelength-converted by the fluorescent material that forms a projection in the light exit surface can be emitted directly to the atmosphere through no needless interposition (other than the resin coating over the fluorescent material). Accordingly, the device is configured to achieve an excellent efficiency of light extraction without suffering total reflection and refraction.

Examples of the effects of the semiconductor light emitting device of the invention are described below.

(1) The semiconductor light emitting element and the bonding wire can be entirely sealed in the light-transmissive resin that has a refractive index close to that of the semiconductor material that forms the exit surface of the semiconductor light emitting element. This configuration is effective in protecting the semiconductor light emitting element and the bonding wire from mechanical stresses, such as vibrations and impacts, and environmental conditions, such as water content and dirt and dust. In addition, the light emitted from the semiconductor light emitting element can be controlled to include as little light as possible that is totally reflected at the light exit surface of the semiconductor light emitting element and that returns into the semiconductor light emitting element. Thus, a great amount of light from the semiconductor light emitting element can be radiated and transmitted through the light exit surface to the interface-forming member to improve the efficiency of extraction of the light from the semiconductor light emitting element.

(2) The cavity can be formed in multi-stages to fill resins in stages. In this case, the light-transmissive resin that is filled in the lower cavity can be prevented from flowing into the upper cavity by the adhesion between the upper surface inner rim of the cavity and the resin, and by the surface tension associated with an appropriately selected viscosity for the resin. Thus, an almost planar surface can be formed over substantially the entire resin material. As a result, the light-transmissive resin containing the fluorescent material dispersed therein and that is filled in the upper cavity can also be provided with an almost entirely planar surface.

(3) When the product in (2) is turned upside down for curing, the fluorescent material sinks such that it is located near the almost planar surface of the light-transmissive resin that contains the fluorescent material dispersed therein and that is filled in the upper cavity to form the high-density fluorescent material layer. As a result, the high-density fluorescent material layer has an almost uniform thickness over substantially the entire surface, which results in a light source with less variation in color and brightness.

(4) In the related art, the light emitted from the semiconductor light emitting element can not reach an area in the vicinity of a step at a common plane between lower and upper cavities because the step prevents it. Accordingly, the fluorescent material dispersed in the light-transmissive resin at that area is not effective for wavelength conversion and results in a light source with variations in color and brightness. To the contrary, in the above described embodiment(s), the high-density fluorescent material layer can be formed at a location in the vicinity of the surface of the resin which is higher than that of the related art. Thus, the light emitted from the semiconductor light emitting element is not blocked and can reach the fluorescent material layer. As a result, a light source with decreased variations in color and brightness can be achieved.

(5) The high-density fluorescent material layer can be formed uniformly and in the vicinity of the light exit surface. Accordingly, the fluorescent material can form projected and recessed patterns in a surface condition. Therefore, the light, which is emitted from the semiconductor light emitting element and wavelength-converted at the fluorescent material, and the light, which is only emitted from the semiconductor light emitting element, have less deflection at the light exit surface when the surface condition includes projected and recessed patterns. Thus, the light can be provided with averaged scattering and refracting in all orientations. In addition, the light that is wavelength-converted at the fluorescent material that is formed at the projection in the light exit surface can be emitted directly to the atmosphere through no needless interposition (other than the resin coating over the fluorescent material). Accordingly, the device can be configured to achieve an excellent efficiency of light extraction without suffering total reflection and refraction.

(6) A reflective frame with a reflective surface formed thereon can be formed on the casing. Thus, the light that is wavelength-converted at the high-density fluorescent material layer and that travels toward the reflective surface can be reflected at the reflective surface toward the front and in the direction of radiation from the semiconductor light emitting element. As a result, the light that previously could not contribute to the collection of light even when it was wavelength-converted at the high-density fluorescent material layer can now be collected effectively in the vicinity of the optical axis of the semiconductor light emitting element. Thus, an improvement is realized in the efficiency of available light and a higher brightness is achieved at the light source. In addition, when the casing is turned upside down for curing the resin, the reflective frame can also serve as a spacer tool. Accordingly, a spacer for reverse support may not be required.

Having described exemplary embodiments consistent with the invention, other embodiments and variations consistent with the invention will be apparent to those skilled in the art. Therefore, the invention should not be viewed as limited to the disclosed embodiments but rather should be viewed as limited only by the spirit and scope of the appended claims.

What is claimed is:

1. A semiconductor light emitting device, comprising:
    a casing including,
        a first cavity that has a first bottom and is formed in a conical shape that opens upward from the first bottom, the first cavity having a first inner circumferential surface serving as a reflective surface, and
        a second cavity provided immediately above the first cavity, the second cavity including a second bottom having a flat surface, the second bottom being larger than the first cavity and forming a common plane with the first cavity, the second cavity having a substantially vertically upstanding inner circumferential surface, having a larger circumference than a circumference of the first cavity and being formed upward from the second bottom;
    a third cavity provided immediately above the second cavity, the third cavity including a third inner circumferential surface located on a substantially same extension from the first inner circumferential surface, the third inner circumferential surface serving as a second reflective surface;
    at least one semiconductor light emitting element located adjacent the first bottom of the first cavity;
    a first resin located in the first cavity to seal the at least one semiconductor light emitting element; and
    a second resin located in the second and third cavities, the second resin including a light-transmissive resin containing a wavelength converter dispersed therein.

2. The semiconductor light emitting device according to claim 1, wherein the first resin is composed of a light-transmissive resin, and the first resin having a surface that is substantially planar.

3. The semiconductor light emitting device according to claim 2, wherein the second resin is composed of a light-transmissive resin containing a wavelength converter dispersed therein.

4. The semiconductor light emitting device according to claim 2, wherein the second resin has an exterior surface, and a layer of a high-density wavelength converter is formed at a higher density adjacent the exterior surface of the second resin as compared to a density of the wavelength converter adjacent an opposing interior surface of the second resin.

5. The semiconductor light emitting device according to claim 2, further comprising:
    a reflective frame located above the casing and having a recessed oblique reflective curved surface, wherein the curved surface is defined by an imaginary straight line that is revolved about an optical axis of the at least one semiconductor light emitting element, the straight line being opened substantially frontward and in a direction of radiation from the at least one semiconductor light emitting element.

6. The semiconductor light emitting device according to claim 1, wherein the second resin has an exterior surface, and a layer of a high-density wavelength converter is formed at a higher density adjacent the exterior surface of the second resin as compared to a density of the wavelength converter at an opposing interior surface of the second resin.

7. The semiconductor light emitting device according to claim 6, further comprising:
    a reflective frame located above the casing and having a recessed oblique reflective curved surface, wherein the curved surface is defined by an imaginary straight line that is revolved about an optical axis of the at least one semiconductor light emitting element, the straight line being opened substantially frontward and in a direction of radiation from the at least one semiconductor light emitting element.

8. The semiconductor light emitting device according to claim 1, further comprising:
    a reflective frame located above the casing and having a recessed oblique reflective curved surface, wherein the curved surface is defined by an imaginary straight line that is revolved about an optical axis of the at least one semiconductor light emitting element, the straight line being opened substantially frontward and in a direction of radiation from the at least one semiconductor light emitting element.

9. The semiconductor light emitting device according to claim 1, wherein the second resin has an exterior surface, and a layer of a high-density wavelength converter is formed at a higher density adjacent the exterior surface of the second resin as compared to a density of the wavelength converter adjacent an opposing interior surface of the second resin.

10. The semiconductor light emitting device according to claim 1, further comprising:
    a reflective frame located above the casing and having a recessed oblique reflective curved surface, wherein the curved surface is defined by an imaginary straight line that is revolved about an optical axis of the at least one semiconductor light emitting element, the straight line being opened substantially frontward and in a direction of radiation from the at least one semiconductor light emitting element.

11. The semiconductor light emitting device according to claim 1, wherein the second resin has a viscosity when uncured that allows it to contain the first resin when uncured in the first cavity when the casing is upside down.

12. The semiconductor light emitting device according to claim 1, wherein the second resin forms an exterior surface and includes a high-density wavelength converter dispersed such that the high-density wavelength converter is denser at a location closer to the exterior surface than at a location away from the exterior surface.

13. The semiconductor light emitting device according to claim 1, wherein the third cavity includes a wall surface that extends substantially radially from the at least one semiconductor light emitting element.

14. The semiconductor light emitting device according to claim 1, wherein at least one of the second and the third cavity is larger than the first cavity.

15. A semiconductor light emitting device, comprising:
a casing including,
   a first cavity that has a first bottom and is formed in a conical shape that opens upward from the first bottom, the first cavity having a first inner circumferential surface serving as a first reflective surface, and
   a second cavity provided immediately above the first cavity, the second cavity including a second bottom having a flat surface, the second bottom being larger than the first bottom and forming a common plane with the first cavity, the second cavity having a substantially vertical upstanding inner circumferential surface, having a larger circumference than a circumference of the first cavity and being formed upward from the second bottom;
a reflective frame formed on the casing, the reflective fame including a third inner circumferential surface located on a substantially same extension from the first inner circumferential surface, the third inner circumferential surface serving as a second reflective surface;
at least one semiconductor light emitting element located adjacent the first bottom of the first cavity;
a first resin located in the first cavity to seal the at least one semiconductor light emitting element; and
a second resin located in the second cavity provided immediately above the first cavity, the second resin including a wavelength converter deposited at a higher density closer to an exterior surface of the second resin than to an interior surface of the second resin to form a high-density wavelength converter layer.

* * * * *